United States Patent [19]

Schroer et al.

[11] Patent Number: 5,436,847
[45] Date of Patent: Jul. 25, 1995

[54] METHOD FOR DETERMINING A PERIODIC PATTERN IN A LINE SPECTRUM

[75] Inventors: Wolfgang Schroer, Ulm; Christoph Bauer, Dornstadt; Johannes Schmid, Ulm, all of Germany

[73] Assignee: Deutsche Aerospace AG, München, Germany

[21] Appl. No.: 249,937

[22] Filed: May 26, 1994

[30] Foreign Application Priority Data

May 26, 1993 [DE] Germany .......... 43 17 424.8

[51] Int. Cl.⁶ .......... G01R 23/16; G01R 23/00
[52] U.S. Cl. .......... 364/485; 395/900
[58] Field of Search .......... 364/485; 395/900; 324/76.12, 76.19

[56] References Cited

U.S. PATENT DOCUMENTS

| | | | |
|---|---|---|---|
| 4,084,245 | 4/1978 | Bunge | 364/485 |
| 4,344,031 | 8/1982 | Kuhn et al. | 324/77 R |
| 4,453,550 | 1/1984 | Flax | 128/660 |
| 4,782,284 | 11/1988 | Adams et al. | 324/77 B |
| 4,817,158 | 3/1989 | Picheny | 381/47 |
| 5,177,691 | 1/1993 | Welles et al. | 364/485 |
| 5,189,727 | 2/1993 | Guerreri | 395/2 |
| 5,245,445 | 9/1993 | Fujisawa | 358/458 |

OTHER PUBLICATIONS

Ariyoshi et al., "Speech Recognition Processors Using Fuzzy Pattern Matching", 1988.
Li et al., "Spectral Histogram and Its Applications to Flaw Detection," 1988.
Elektronik Journal, Apr., 1993, pp. 14–18, 23; "Formalisiertes Ingenieurgefühl", Maier, et al.

*Primary Examiner*—Ellis B. Ramirez
*Assistant Examiner*—Patrick J. Assouad
*Attorney, Agent, or Firm*—Spencer, Frank & Schneider

[57] ABSTRACT

The invention relates to a method for determining a periodic pattern in an amplitude spectrum, for example, in a Doppler spectrum of a radar echo. A residual spectrum is formed using Fuzzy Set Theory, and the periodic pattern is determined for each residual spectrum by histogramming the original spectrum. The method can be used for identifying aircraft, for example helicopters, that have periodically-moving components, e.g., rotors, that generate a periodic pattern in a Doppler spectrum.

12 Claims, 3 Drawing Sheets

FIG. 3
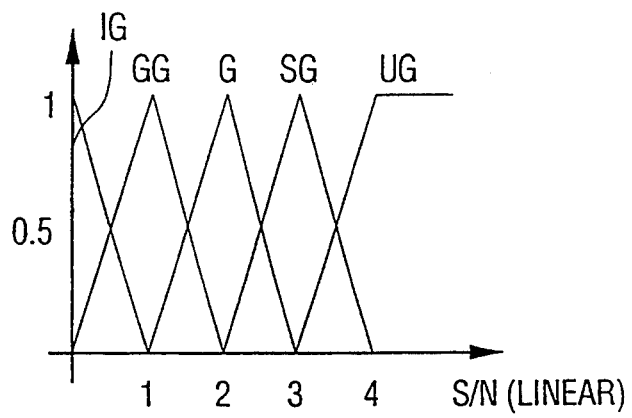
FIG. 4
| | CONTINUATION LINE | | | | |
|---|---|---|---|---|---|
| | | IG | GG | G | SG | UG |
| LINE | IG | UW | UW | UW | UW | UW |
| | GG | UW | WW | WW | WW | WW |
| | G | UW | WW | W | W | W |
| | SG | UW | WW | W | SW | SW |
| | UG | UW | WW | W | SW | HW |
FIG. 5
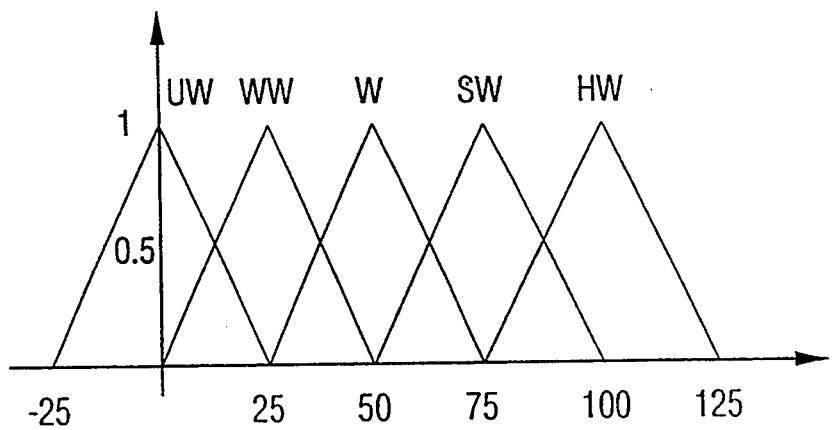

METHOD FOR DETERMINING A PERIODIC PATTERN IN A LINE SPECTRUM

CROSS-REFERENCE TO A RELATED APPLICATION

The present application claims the right of foreign priority with respect to Application No. P 43 17 424.8 filed in Germany on May 26, 1993.

BACKGROUND OF THE INVENTION

1. Field of the Invention

The present invention relates to a method for determining a periodic structure or pattern in a line spectrum. More particularly, the present invention relates to a method for determining a periodic structure or pattern in a line spectrum caused by a modulation having a fundamental period, such as a periodically moving part as detected by a coherent Doppler radar.

2. Description of the Related Art

In many technical fields it is necessary to determine a periodic structure or pattern from an amplitude spectrum. Periodically moving or rotating parts, for example, helicopter rotor blades, and/or the rotational movement of a turbine of an airplane, can be inferred from periodic patterns in, for example, coherent Doppler radar spectra. Additional information of this type is necessary in, for example, target classification of radar echoes by a ground radar station of an airport.

Periodic structures, or patterns, also occur in machinery during a so-called noise analysis of the machinery. For example, the state of wear of a cutting tool can be inferred from noise, whether airborne or structure-borne noise, produced by a metal-cutting machine, e.g., a lathe or milling machine, through spectral analysis of the noise. A periodic pattern in the noise caused by rotational motion of the lathe or milling machine produces an amplitude spectrum which can be analyzed.

Determination of periodic patterns is also required in numerous areas of electrical technology such as, for example, in monitoring and/or identifying a radio transmitter. In applications of this type, a spectrum analyzer can detect an amplitude spectrum. Generally, this detected spectrum includes a reference line, also referred to as a zero line or base line, and a plurality of line spectra which are contiguous on one or both sides of the zero line. In such a line spectrum, a periodic pattern caused by, for example, a periodic amplitude modulation, can be determined because the harmonics of the modulation, also known as continuation lines, are present for every spectral line contiguous to the zero line.

An evaluation of this type is difficult or even, perhaps, impossible when the periodic pattern which is to be analyzed is covered or masked by a number of interfering spectral lines caused by, for example, noise and/or non-periodic, deterministic spectral components.

SUMMARY OF TEE INVENTION

It is therefore an object of the invention to provide a generic method with which reliable determination of periodic structures or patterns appearing in amplitude spectra is permitted.

The present invention provides a method for determining a periodic pattern in a line spectrum which includes the steps of forming an original amplitude line spectrum having a reference line and a plurality of spectral lines which are contiguous to the reference line, forming a plurality of intervals in the line spectrum by combining a first predetermined number of contiguous spectral lines of the original amplitude spectrum, determining a mean value for each respective interval based on an amplitude of each spectral line combined to form the respective interval, filtering the amplitude of each spectral line of the original amplitude spectrum with a predetermined factor, normalizing the filtered amplitude of each spectral line of each respective interval with the associated mean value of the respective interval, categorizing the normalized amplitudes of the spectral lines into a plurality of overlapping normalized amplitude categories, determining a periodic complement to each respective spectral line which is a continuation line that is at least contiguous to the reference line for each spectral line and forms a line pair with the respective spectral line, categorizing each line pair in a relevance category as a function of a predetermined combination of the normalized amplitude categories such that each relevance category has a predetermined relevance value range, determining a relevance value for each line pair, determining a maximum relevance value for all line pairs associated with one spectral line, associating the determined maximum relevance value with the spectral line, forming a residual spectrum from spectral lines having an associated relevance value which is greater than a predetermined threshold value, histogramming the original spectrum to determine the number of continuation lines associated with each respective spectral line of the residual spectrum, determining the spectral line having the greatest number of continuation lines from the histogram, and determining a modulation frequency of the periodic pattern based on the difference in frequency between the spectral line having the greatest number of continuation lines and the reference line.

Preferably, the original amplitude spectrum is digitized. The method according to the invention can additionally include the step of thinning the original amplitude spectrum by combining a second predetermined number of respectively contiguous spectral lines into a single spectral line in the spectrum, and assigning each single spectral line an amplitude which equals a maximum amplitude of the second predetermined number of spectral lines combined to form the respective single spectral line. Preferably, the amplitude spectrum has a frequency resolution that is finer than the modulation frequency of the periodic pattern, and the amplitude spectrum is represented by a linear scale.

The amplitude categories and the relevance classes, according to the invention, have association functions which are linear in a changeover region. Preferably, the amplitude classes in which the spectral lines of a line pair are categorized are combined by an AND operator, and a result of the combination by the AND operation is assigned to a predetermined relevance class. Fuzzy Set Theory is used to determine the periodic pattern. Preferably, the step of histogramming includes multiplying amplitude values of the spectral lines by a weighing coefficient. Further, only spectral lines of the residual spectrum having a simple distance from the reference line and/or simple fractions of a distance from the reference line are histogrammed.

According to the method of the invention, a periodic pattern formed by an aircraft or by a helicopter, having periodically-moving components which modulate a radar signal, can be determined.

The invention is based on use of the known "Fuzzy Set Theory," which is described, for example, in the publication of H. Maier and T. Bessner, Formalisiertes Ingenieurgefühl, Elektronik Journal, 4/93, pp. 14–23. Processing of electrical signals with the aid of Fuzzy Set Theory is possible with appropriately configured electronic switching circuits and/or a data processing system.

BRIEF DESCRIPTION OF THE DRAWINGS

The various objects of the present invention, together with other advantages and benefits which may be attained by its use, will become more apparent in view of the following detailed description of the method according to the invention taken in conjunction with the drawings.

FIG. 3 As an example diagram showing a degree of matching for a line distribution as a function of linear ratio S/N.

FIG. 4 shows an example of a rule catalog for assigning a relevance class to every possible combination of amplitude value of line pairings according to the invention.

FIG. 5 shows an example of a categorization of relevance classes as a function of the relevance values according to the invention.

DETAILED DESCRIPTION OF THE PREFERRED EMBODIMENT

Figure 1:
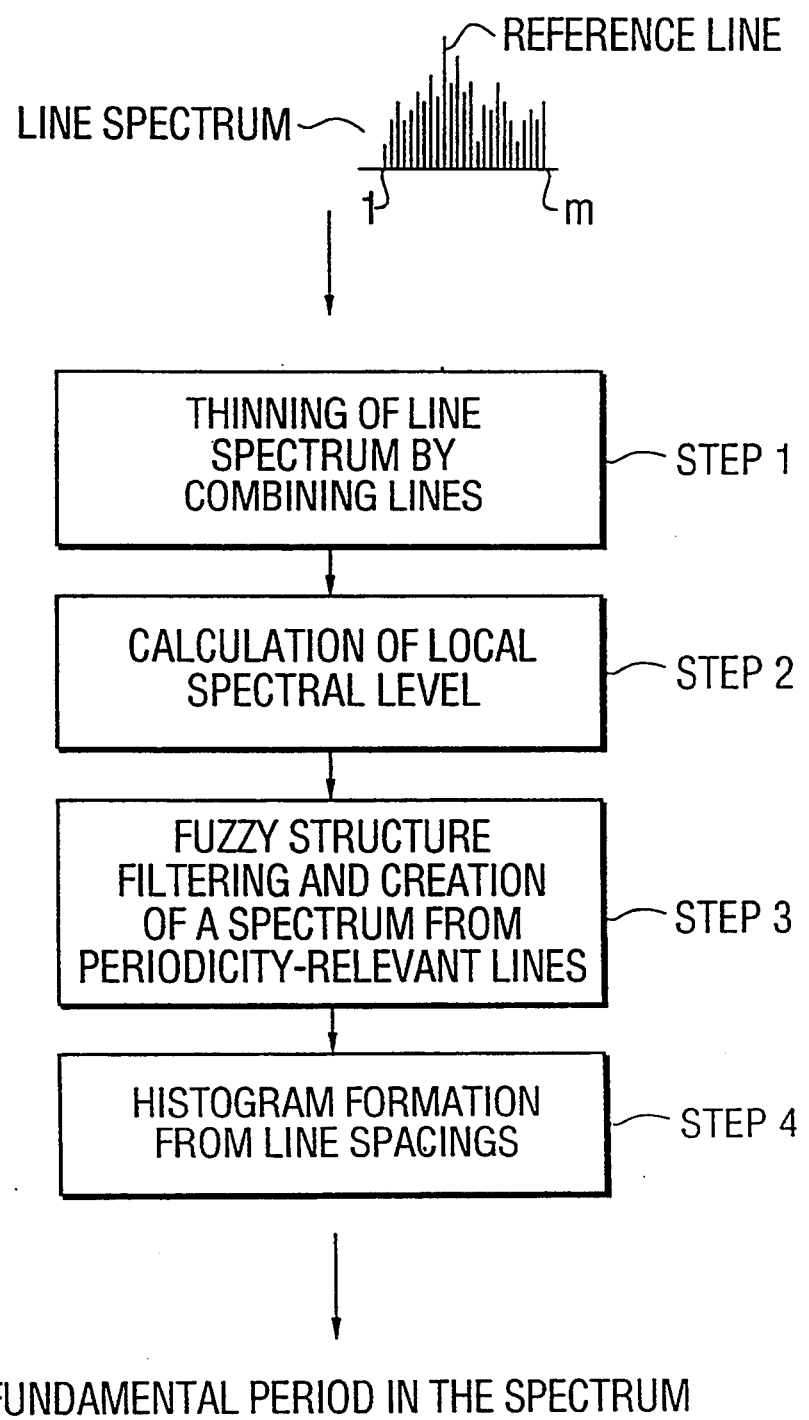
FIG. 1 is a flow diagram of a method of determining a periodic pattern in a line spectrum according to the invention.

FIG. 1 is a block diagram, which is subdivided into four steps, showing the method according to the present invention. The method is based on analyzing an original spectrum which has been digitized and configured as an amplitude spectrum arranged as a line spectrum having m spectral lines. Such a line spectrum can be produced from, for example, a digitized electrical signal using a discrete fourier transformation (DFT). The spectral lines of the spectrum have a minimum frequency distance dF between the respective spectral lines which is determined by the sampling rate used for the DFT. In a coherent Doppler radar system, the spectrum exhibits a reference, or zero, line that corresponds to, for example, the radial velocity of a target, such as a rotor blade of a helicopter. Particular spectral lines which are related to parts which periodically move, e.g., the main blade of a helicopter, are present on both sides of the reference line. A rotating main rotor generates a periodic line pattern in the line spectrum that is determined by the method of the present invention. It is advantageous to select the frequency distance dF to be less than the searched-for fundamental period P of the periodically moving part, for example, dF is chosen so that dF $\leq 0.1$ P. A periodic structure or pattern mainfests itself in the spectrum as an increase of the spectral lines with respect to their adjacency recurring in the distance iadF (in terms of frequency) from the reference line where i=1,2,3, ..., and a is an integer. Therein, P=adF is the searched-for period P in the original amplitude spectrum. In many applications, however, the original amplitude spectrum has a much higher spectral resolution than the resolution necessary for determining period P, e.g., dF=0.01 P. In such a situation, the original spectrum is first thinned by reducing the number of spectral lines to a predefined number of spectral lines at step 1 in FIG. 1.

Further determination of the searched-for fundamental period P in steps 2 through 4 is supported by a rule-based evaluation of the spectral lines predetermined using Fuzzy Set Theory. Generally, a plurality of relevant spectral lines is first selected to form a residual spectrum. Each of the relevant spectral lines can correspond to the searched-for fundamental period P. That is, the fundamental period P is not unequivocally determined at first. By histogramming the line spacings of the original amplitude spectrum, the searched-for fundamental period P is determined from the residual spectrum of periodicity-relevant lines.

In step 1, the original line spectrum is thinned to a predefined number of lines;

In step 2, a local spectral level is determined and the amplitudes of the spectral lines of the thinned spectrum are threshold filtered;

In step 3, periodicity-relevant lines are determined using fuzzy structure filtering forming a residual spectrum; and In step 4, the fundamental period P is determined through histogramming.

These methods steps are described individually in detail below.

Step 1: Thinning the original line spectrum

While loss of information can occur, albeit negligible in some instances, by reducing the number of spectral lines under consideration (reduction of the spectral resolution), the reduction of the number of spectral lines to a predefined number significantly reduces the processing expenditure in an advantageous manner, permitting fast and cost-effective execution of the method, particularly with the aid of a data-processing system.

In the thinned or condensed spectrum, the reference line represents the zero point. Each n successive lines of the original spectrum, both above and below the reference line in frequency, are combined into a single line of the thinned spectrum so that the line spacing is increased to ndF. The result is a total of ko lines above the reference line, and a total of ku lines below the reference line with each line of the thinned spectrum having an amplitude which is the maximum of the amplitudes of the corresponding n successive lines of the original spectrum. The amplitudes of the lines of the thinned spectrum are represented linearly, not logarithmically. The amplitude of the reference line is irrelevant for the method and its spectral position defines the reference (zero) point for the method according to the invention. The number of lines n is selected so that the line density of the thinned spectrum is approximately ten times greater than the searched-for fundamental period P.

An example which is symmetrical about a reference line, that is, with ku=ko, has the following thinned spectrum resulting from 8192 original spectral sample points with line 4096 chosen as the reference line and with n=16:

--- the maximum amplitude from line 4097–4112 is line +1
the maximum amplitude from line 4095–4080 is line −1
the maximum amplitude from line 4113–4128 is line +2
the maximum amplitude from line 4079–4064 is line −2

.
.

the maximum amplitude from line 8177–8192 is line 256

-continued maximum amplitude from line 15–1 is line −256

Note that there is an irregularity in thinning the original spectrum present in this example because a line is missing in the original spectrum, that is, the reference line accounts for 1 of the lines (line 4096) of the original spectrum.

Step 2: Determining the local spectral level and threshold filtering

A local spectral level is determined for the thinned spectrum. The thinned spectrum is subdivided into intervals which include every u contiguous lines (e.g., u=8), and a local spectral level is determined by calculating the mean value of the amplitudes of the u lines for each respective interval. In the subsequent steps for determining periodicity-relevant lines according to the invention, only the lines having an amplitude exceeding the respective local spectral level by a predetermined factor, typically 1, are considered further. Each line of the thinned spectrum is represented by its amplitude (indicated below as $A_n$) which has been normalized to the associated local spectral level.

Step 3: Fuzzy structure filtering for determining periodicity-relevant lines, and formation of a residual spectrum from the periodicity-relevant lines In this method step, lines of the thinned spectrum are selected that have a periodic continuation in the spectrum, or lines that have a complement which is symmetrical to the zero point. Fundamental period P is determined from these relevant lines in step 4.

The selection of periodic lines is effected using fuzzy algorithms. In order to suppress noise, the fuzzy algorithm determines a relevance value for all periodically recurrent lines. As a consequence, lines with little relevance are suppressed by threshold comparison.

Figure 2:
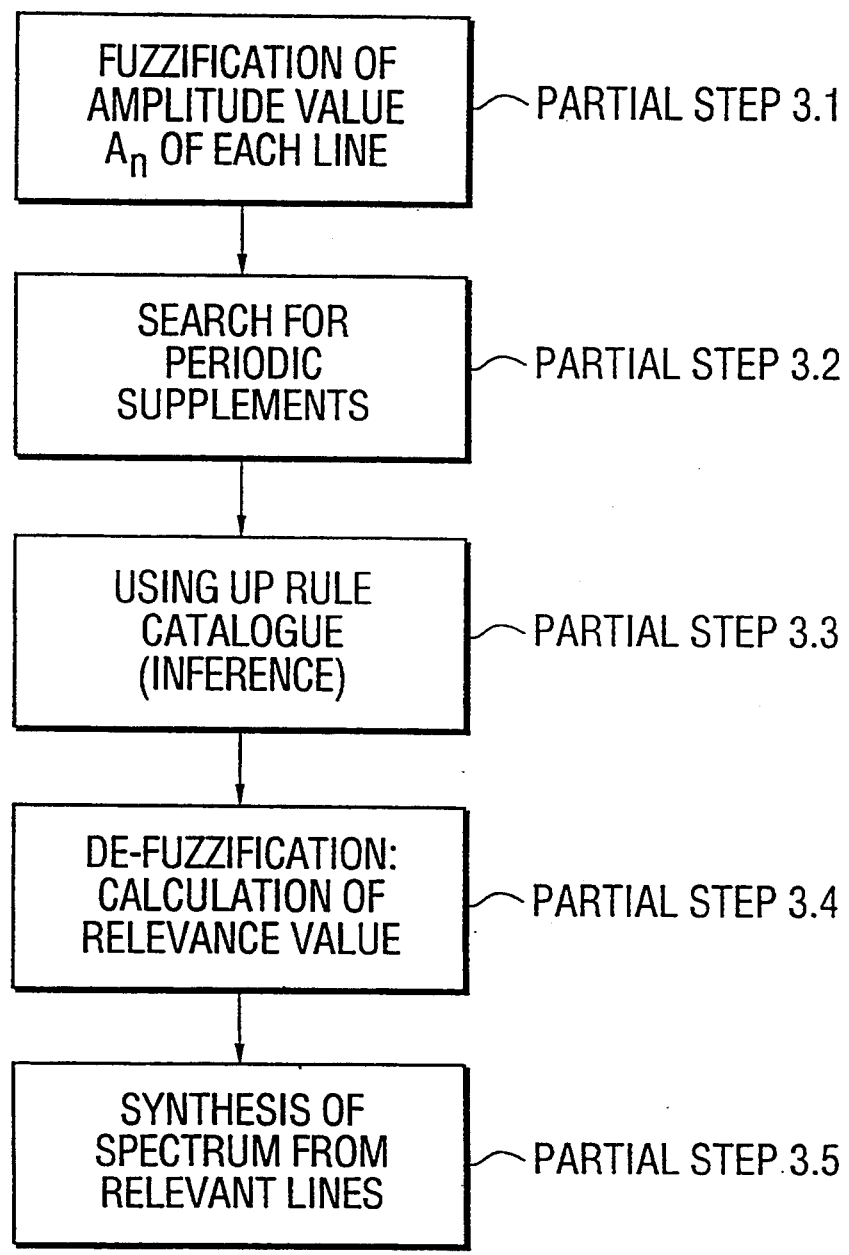
FIG. 2 is a flow diagram of partial steps for determining periodicity-relevant lines according to the present invention.

FIG. 2 shows in a block diagram the individual partial steps of this method step, which are explained below.

Partial step 3.1:

The fuzzy algorithm evaluates a normalized amplitude value $A_n$ for each spectral line of the thinned spectrum which corresponds to a linear signal ratio S/N with respect to the associated local spectral, or threshold, level. This linear signal ratio S/N of an amplitude value $A_n$ is fuzzified, that is, assigned to a fuzzy class in accordance with the following assignment specification:

| Class | $A_n$ Range |
| --- | --- |
| IG (less than threshold) | $0 < A_n < 1$ |
| GG (identical in value) | $0 < A_n < 2$ |
| G (greater than threshold) | $1 < A_n < 3$ |
| SG (much greater than threshold) | $2 < A_n < 4$ |
| UG (substantially greater than threshold) | $3 < A_n < \infty$ |

This is illustrated in FIG. 3. The linear distance S/N is plotted along the abscissa, and the degree of matching to the class (between the values of 0 and 1) is plotted along the ordinate. The S/N value ranges belonging to the classes, and the type of overlap of the classes (e.g., linear in this case) is selected as a function of the particular application.

Partial step 3.2:

In this partial step, a periodic complement for each spectral line of the thinned spectrum is searched for. Periodic complements are:

- spectral lines occurring at twice the distance from the reference line as the spectral line under consideration;
- spectral lines having a position which is mirror-symmetrical to the spectral line under consideration with respect to the reference line;
- spectral lines occurring at twice the distance from the reference line as the spectral line under consideration on the other side of the reference line; and
- optionally, spectral lines at three times the distance from the reference line as the spectral line under consideration on both sides of the reference line.

To search for a periodic complement, a window function which is ±1 times the line spacing is used on the thinned spectrum to compensate for irregularities caused by the combination of lines in step 1 or caused by leakage effects during determination of the spectrum. The largest line found within the window, also called the continuation line, is determined to be a periodic complement for the spectral line under consideration.

Partial step 3.3:

Each line pairing, or periodic complement, determined in partial step 3.2 is assessed in accordance with a rule catalog. FIG. 4 shows an example of a rule catalog, which assigns one of the relevance classes or categories, to every possible combination of amplitude values of the line pairing:

| | |
| --- | --- |
| HW | "highly probable" |
| SW | "very probable" |
| W | "probable" |
| WW | "not very probable" |
| UW | "improbable" |

Number values from −25 to 125, also called relevance values, correspond to the relevance classes. FIG. 5 illustrates a categorization for these relevance classes (RC) along the ordinate as a function of the relevance values (RV) along the abscissa. The linear overlap between the relevance classes shown in this example is selected as a function of the particular application.

The categorization of a line pairing of a spectral line and continuation line under a relevance class is effected by operators which are typical in Fuzzy Set Theory and with which the lines classified in partial step 3.1 are combined. For the present application, only the "and" operator is used. The result is the following combination.

| | |
| --- | --- |
| If | the line is very large (SG) |
| and | the continuation line, or counter line, is very large (SG) |
| then | the combination is very probably (SW) a relevant line pair. |

The rule catalog of FIG. 4 can be produced with combinations of this type.

Partial step 3.4:

Because a categorization of the line pairing under several relevance classes is possible due to the overlapping assignment (FIG. 3) of amplitude values $A_n$ (input variables), and because of the combinations mentioned in partial step 3.3, the relevance value of the pairing must be determined through de-fuzzification. The known Center of Average (COA) method is used as the de-fuzzification method. The result is a relevance value in the value range $$0 \leq \text{relevance value} \leq 100.$$

Partial step 3.5:

Because a plurality of periodic complements is generally present for leach line in a thinned spectrum, every line is assigned the maximum relevance value determined for all pairings considered that include this line. Lines with little relevance are separated out through threshold value filtering. A relevance value of 50, for example, is used as the threshold.

Step 4: Period calculation through histogramming

In steps 1 through 3, a residual spectrum was generated comprising only residual lines in which a predefined, minimum relevance value is exceeded. In this step the searched-for fundamental period P is determined through histogramming. First, the distances in terms of frequency of the respective residual lines from the reference line in the residual spectrum are determined. These distances are then superposed onto associated (matching) distances in the original amplitude spectrum based on the formulas mentioned at the outset. In this spectrum the simple (integer) distances from the reference line for each residual line are histogrammed, as are simple fractions, i.e., $\frac{1}{2}$, $\frac{1}{3}$, $\frac{1}{4}$, of these distances. The normalized $A_n$ values of the residual lines, as well as their harmonics, are multiplied with weighting coefficients and added to the histogram.

The following values are examples of weighing coefficients:

for simple (integer) distances from the reference line
weight=1.0
for half-, one-third and one-fourth distances
weight=0.9

The distance in terms of frequency that has the maximum value of the accumulated lines in the histogram is selected as fundamental period P.

The described method advantageously has numerous applications. One example is the mentioned evaluation of radar echoes from a target. For example, differentiation, that is classification, of helicopters, or a propeller of an airplane or jet planes is possible. Technical monitoring of a transmitter is also possible.

The foregoing is a complete description of the present invention. The scope of the invention should only be limited by the following claims.

What is claimed:

1. A method for determining a periodic pattern in a line spectrum comprising the steps of:
   forming an original amplitude line spectrum having a reference line and a plurality of spectral lines which are contiguous to the reference line;
   forming a plurality of intervals in the line spectrum by combining a first predetermined number of contiguous spectral lines of the original amplitude line spectrum;
   determining a mean value for each respective interval based on an amplitude of each spectral line combined to form the respective interval;
   filtering the amplitude of each spectral line of the original amplitude line spectrum with a predetermined factor;
   normalizing the filtered amplitude of each spectral line of each respective interval with the associated mean value of the respective interval;
   categorizing the normalized amplitudes of the spectral lines into a plurality of overlapping normalized amplitude categories;
   determining a periodic complement to each respective spectral line which is a continuation line that is at least contiguous to the reference line for each spectral line and forms a line pair with the respective spectral line;
   categorizing each line pair in a relevance category as a function of a predetermined combination of the normalized amplitude categories, each relevance category having a predetermined relevance value range;
   determining a relevance value for each line pair;
   determining a maximum relevance value for all line pairs associated with one spectral line;
   associating the determined maximum relevance value with the spectral line;
   forming a residual amplitude line spectrum from spectral lines having an associated relevance value which is greater than a predetermined threshold value;
   histogramming the original amplitude line spectrum to determine the number of continuation lines associated with each respective spectral line of the residual amplitude line spectrum;
   determining the spectral line having the greatest number of continuation lines from the histogram; and
   determining a modulation frequency of the periodic pattern based on the difference in frequency between the spectral line having the greatest number of continuation lines and the reference line.

2. A method according to claim 1, wherein the original amplitude line spectrum is digitized.

3. A method according to claim 1, further comprising the steps of thinning the original amplitude line spectrum by combining a second predetermined number of respectively contiguous spectral lines into a single spectral line in the line spectrum, and assigning each single spectral line an amplitude which equals a maximum amplitude of the second predetermined number of spectral lines combined to form the respective single spectral line.

4. A method according to claim 1, wherein the original amplitude line spectrum has a frequency resolution that is finer than the modulation frequency of the periodic pattern, and wherein the original amplitude line spectrum is represented by a linear scale.

5. A method according to claim 1, wherein the amplitude categories have an association function which is linear in a changeover region.

6. A method according to claim 1, wherein the relevance classes have an association function which is linear in a changeover region.

7. A method according to claim 1, wherein the amplitude classes in which the spectral lines of a line pair are categorized are combined by an AND operator, and a result of the combination by the AND operation is assigned to a predetermined relevance class.

8. A method according to claim 1, wherein the periodic pattern is determined based on Fuzzy Set Theory.

9. A method according to claim 1, wherein the step of histogramming includes multiplying amplitude values of the spectral lines by a weighing coefficient.

10. A method according to claim 1, wherein only spectral lines of the residual spectrum having a simple distance from the reference line and/or simple fractions of a distance from the reference line are histogrammed.

11. A method according to claim 1, wherein the periodic pattern is formed by an aircraft having periodically-moving components which modulate a radar signal.

12. A method according to claim 1, wherein the periodic pattern is formed by a helicopter.

* * * * *